(12) United States Patent
Agarwal (10) Patent No.: US 6,870,393 B2
(45) Date of Patent: Mar. 22, 2005

(54) FIELD PROGRAMMABLE DEVICE (75) Inventor: Deepak Agarwal, High Wycombe (GB)

(73) Assignee: STMicroelectronics Limited (GB)

( * ) Notice: Subject to any disclaimer, the term of this patent is extended or adjusted under 35 U.S.C. 154(b) by 0 days.

(21) Appl. No.: 10/406,028

(22) Filed: Apr. 2, 2003

(65) Prior Publication Data
US 2004/0017221 A1 Jan. 29, 2004

(30) Foreign Application Priority Data

Apr. 3, 2002 (EP) .............................................. 02252425

(51) Int. Cl.[7] ............................................ H03K 19/127

(52) U.S. Cl. .............................. 326/38; 326/40; 326/41

(58) Field of Search .............................. 326/37–41, 46, 326/47

(56) References Cited

U.S. PATENT DOCUMENTS 6,037,800 A  *  3/2000  Trimberger .................... 326/38
6,249,144 B1     6/2001  Agrawal et al. ............... 326/40

OTHER PUBLICATIONS

EPO; European Search Report for 02252425.0; Sep. 17, 2002.

* cited by examiner

Primary Examiner—Anh Q. Tran
(74) Attorney, Agent, or Firm—Jenkens & Gilchrist, PC (57) ABSTRACT A field programmable device including a plurality of logic blocks; a plurality of configurable connections; at least one switching circuit; and a plurality of lines extending at least partially through the device. In a configuration mode, the switching circuit causes configuration signals to be passed to the configurable connections via the plurality of lines and in a processing mode, the plurality of lines are used in at least one of at least one logic block and at least one connection to carry data.

29 Claims, 7 Drawing Sheets

FIELD PROGRAMMABLE DEVICE

BACKGROUND OF THE INVENTION

1. Technical Field of the Invention

The present invention relates to a field programmable device (FPD) and in particular but not exclusively to Field Programmable Gate Arrays (FPGA).

2. Description of Related Art

Programmable gate arrays (PGA) have dramatically changed the process of designing digital hardware over the last few years. Unlike previous generations of digital electronic technology, where board level designs included large numbers of integrated circuits containing basic gates, virtually every digital design produced today consists mostly of high density integrated circuit devices. This is applied not only to custom devices such as processing units and memory, but also to solid state machines such as controllers, counters, registers and decoders.

When such circuits are destined for high volume systems they have been integrated into high density gate arrays, however for prototyping or other low volume situations many product designs are built using field programmable devices (FPD), one variant of which are known as field programmable gate arrays (FPGA). A field programmable device such as the FPGA is at its most basic level a series of configurable logic blocks (CLB), interconnected by a series of configurable connections or links, and read from and written to by a configurable input/output device.

The effectiveness of a field programmable device is the ability of the device to represent a required digital design, and be capable of being altered without the need for complete replacement. This ability is dependent on several factors such as device speed, and the complexity of design capable of being simulated. The complexity of the design is itself dependent on the complexity of the interconnections between the configurable logic blocks, and the number of the configurable logic blocks. The greater the number of blocks and the more complex the interconnection environment, the more complex the design that can be realised.

For any specified logic family and process technology on a fixed sized integrated circuit die, the most significant factor is the complexity or richness of the interconnections between the configurable logic blocks. In other words, for any given process technology where the speed and the size of the switching gate is fixed by practical limitations, and for a given integrated chip size FPD, a greater complexity of linkages can simulate a more complex digital circuit.

The interconnects in the field programmable device, unlike the logic blocks, are not subject to the same improvements in process technology with respect to improvements in feature sizes. Whereas the size of a logic block may be decreased as the size of the gate is decreased, the relative area taken by the interconnects remains the same, as reducing the width of the link increases the link resistance and therefore slows down the speed of the circuit. Reducing the distance between links increases the capacitive and inductive effects experienced between adjacent links which also slow down the circuit as well as increasing interference between links. Decreasing feature size may actually increase the relative area used by the interconnects as a greater number of configurable logic blocks can be introduced onto the same die size IC and therefore requiring a greater number of links not subject to the same reductions in size.

Interconnects are generally programmed, in the case of memory based FPDs, by a series of switching matrices controlled by memory latches. The memory latches create closed or open circuits between pairs of conducting lines. These configuration latches are supplied configuration data from a series of configuration registers and are enabled by an address register in a manner similar to the addressing and writing to a typical memory cell. The address and configuration data are passed to the configuration latches by a series of configuration and address lines. These lines have typically not been used for routing signals when the FPD is set into its active mode, and have been generally ignored as soon as the configuration of the gate array is completed.

This reflects an inefficient use of chip space. As these configuration and address lines are required to reach every switch matrix and configuration latch, they span most of the device area and occupy device area which could otherwise be used to provide interconnectivity between configurable logic blocks.

Solutions for implementing the use of configuration lines have been proposed. U.S. Pat. No. 6,037,800 describes a method for using shared signal lines for interconnection of logic elements and the configuration of a programmable gate array. During configuration of the gate array, the lines used to conduct the configuration signals can be heavily loaded and therefore the configuration is slow or requires more current to compensate for the high loading of the transmission path—with an associated increase in power drain and heat dissipation problem. A further problem associated with the method described in U.S. Pat. No. 6,037,800 is one of data contamination. Data on the data lines may be inadvertently transferred to the configuration line and vice versa.

SUMMARY OF THE INVENTION

It is the aim of the embodiments of the present invention to solve or at least mitigate the problems described above.

There is provided, according to the present invention, a field programmable device including a plurality of logic blocks; a plurality of configurable connections connected to the logic blocks; switching means coupled to the configurable connections; and a plurality of lines extending at least partially through the field programmable device; whereby in a configuration mode, the switching means causes configuration signals to be passed to the configurable connections via the plurality of lines and in a processing mode, the plurality of lines are used in at least one of at least one logic block and at least one connection to carry data.

The field programmable device may further include at least one of the lines passing though a plurality of logic blocks, a plurality of configurable connections, or at least one logic block and one configurable connection. The field programmable device may further include in the processing mode only data being passed within a configurable connection or a logic block on the at least one line.

The field programmable device may further include the switching means having at least one multiplexer.

The field programmable device may further include the switching means having a two-way arrangement allowing the signals to pass along the plurality of lines in either of two directions. The field programmable device may further include the two-way arrangement utilizing a pair of transistors.

The field programmable device may further include one of the transistors being turned on in the configuration mode and turned off in the processing mode, and the other of the transistors being turned off in the configuration mode and turned on in the processing mode.

The field programmable device may further include the switching means being controlled by a control signal which has a first state in the configuration mode and a second state in the processing mode. The field programmable device may further include the control signal being used as a control input to determine which input is selected. The field programmable device may further include the control signal being applied to the gates of the transistors.

The field programmable device may further include the logic blocks being configurable.

The field programmable device may further include the configurable connections including one or more switching matrices.

The field programmable device may further include the configurable connections including one or more configurable latches. The field programmable device may further include the latches being provided with an enable signal when in the configuration mode.

The field programmable device may be a field programmable gate array.

The field programmable device may further include isolating means being provided at an output switching means. The isolating means may be arranged in a configuration mode to isolate a portion of at least one of the plurality of lines from at least one other portion of the same plurality of lines.

Embodiments of the present invention allow the plurality of lines to be used for other purposes, such as carrying data, in a non-configuration mode.

BRIEF DESCRIPTION OF THE DRAWINGS

For a better understanding of the present invention and how the same may be carried into effect, reference will now be made by way of example only to the accompanying drawings in which.

DETAILED DESCRIPTION OF EMBODIMENTS OF THE PRESENT INVENTION

Figure 1:
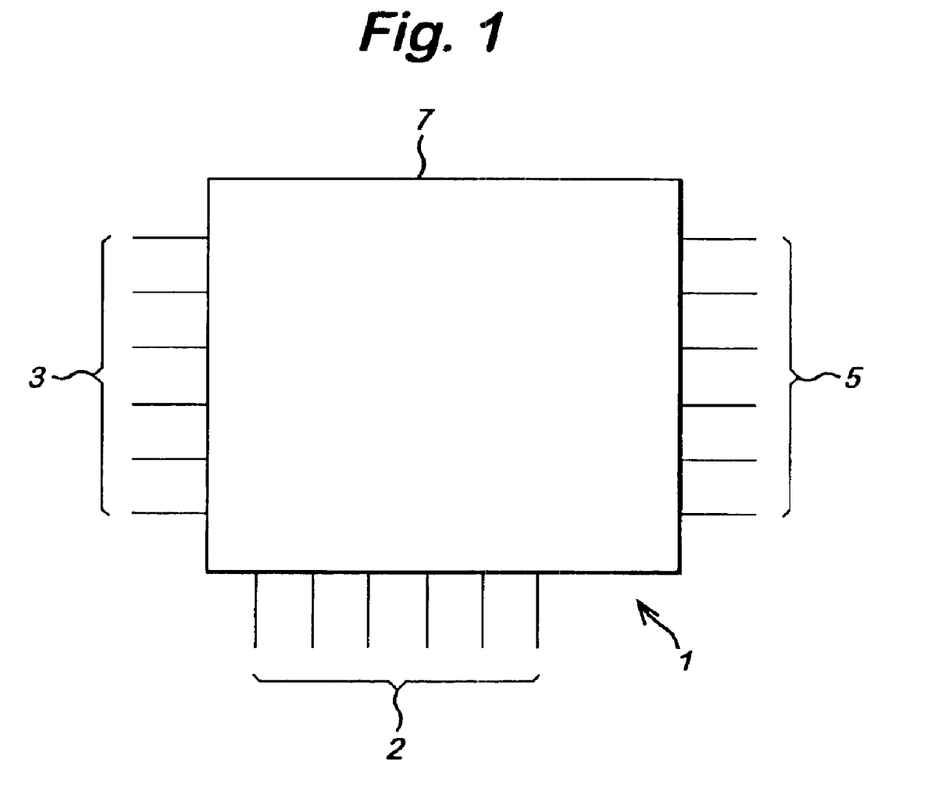
FIG. 1 shows a schematic view of a field programmable device.

Reference is to FIG. 1, which shows a field programmable device within which embodiments of the present invention can be implemented. The Field Programmable Device (FPD) 1 may include a digital logic device 7, and a series of pins providing connections to and from the logic device 7. The pins may be bi-directional or single directional and may be defined based upon the particular application. For example, in FIG. 1 pins 3 provide digital signals to the logic device, i.e. are inputs, and pins 5 provide digital signals from the logic device, i.e. are outputs.

The FPD 1 may be capable of being operated in one of two modes. The first is an active mode, whereby the logic device 7 simulates the action or actions of a digital or a series of digital circuits. The logic device 7 may receive inputs via the input pins 3 and outputs via the output pins 5, whereby the input pins 3 may provide digital data and/or may be a clock signal.

The second mode is a configuration mode. In this mode, the logic device 7 is configured dependent on input data. When configured, the logic device 7 is arranged to simulate the action of the required digital circuit or circuits. This configuration input data may be passed to the logic device 7 via the input pins 3, output pins 5 (acting as input pins) or a separate series of configuration pins 2 (FIG. 1).

Figure 2:
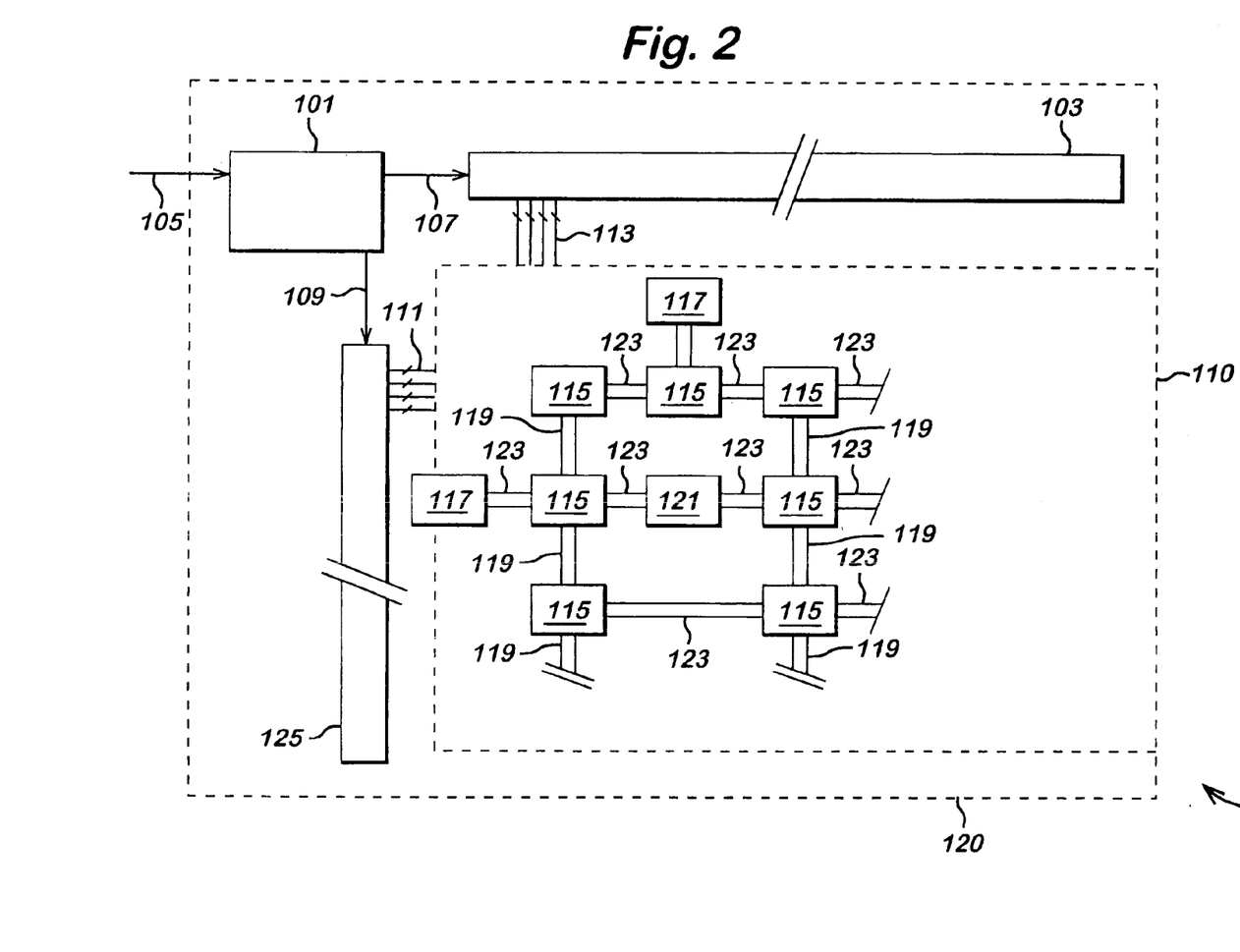
FIG. 2 shows a detailed view of a logic device in the field programmable device of FIG. 1.

With reference to FIG. 2 which shows the FPD 1 in more detail, the logic device 7 may include a processing block 110 having elements needed to allow the FPD 1 to simulate the required circuit. In order to communicate to devices outside the FPD 1, a series of Input/Output Blocks (IOB) 117 are provided at the edges of the processing block 110. These IOBs 117 are configurable to be capable of buffering signals received from and output to the FPD connection pins 3,5. The IOBs 117 are connected to the rest of the processing block 110 by a plurality of vertical conductive paths (or vertical data lines) 119, and horizontal paths (or horizontal data lines) 123. These conductive paths run in vertical and horizontal directions and substantially span the processing block 110 of the digital logic device 7.

These conductive paths, 119 and 123, pass through a series of Switching Matrices (SM) 115, which are located at the intersection of vertical and horizontal paths 119 and 123, respectively. Switching Matrices 115 create short or open circuits, thereby connecting or isolating the paths 119 and 123, in dependence of the configuration of the particular switching matrix 115. The switching matrix 115 thus allows a vertical path 119 to be connected to a horizontal path 123, a horizontal path 123 to pass through the switch matrix 115, and/or a vertical path 119 to pass through the switch matrix 115.

These conductive paths 119 and 123 also pass to and from the terminals of the Configurable Logic Blocks (CLB) 121. The arrangement of the Configurable Logic Blocks 121 and switched matrices 115 is normally such that no two CLBs 121 are directly connected together by a single conductive path 119, 123. Therefore, signals from one CLB 121 to another CLB 121 are routed via switched matrices 115. An alternate arrangement in some areas of the processing block 110 allows direct connections between CLBs 121 in some circumstances.

The CLB 121 can be considered to include a series of look-up tables in a first stage outputting values in dependence on a series of inputs, coupled to a second stage where the values of these look-up tables are logically combined or selected in dependence on the configuration of the particular CLB 121.

In order to configure both the Switched Matrix 115 and the Configurable Logic Block 121, additional circuitry is required. This circuitry is featured in the configuration block 120. The circuitry of the configuration block 120 may include a configuration controller 101, a configuration data register 125 and an address register 103. The configuration controller 101 controls the configuration within the FPD 1. The configuration controller 101 receives signals 105 via the configuration pins 2. The controller 101 can instruct the address registers 103 and configuration data registers 125 via an address register conductive path 107 and a configuration register conductive path 109, respectively. Configuration data, as well as instructions from the controller 101, can also be loaded onto the configuration data register 125 via the same configuration register conductive path 109.

The configuration data is stored on the configuration data register 125 and output to the elements in the processing block 110 on a series of configuration data lines 111. The data is directed to the correct part of the processing block 110 in dependence on the signals output from the address register 103 via the address lines 113. These address lines 113 and configuration data lines 111 intersect the processing block 110, spanning all of the configurable elements in the processing block 110 (this is not shown for clarity purposes).

Figure 3:
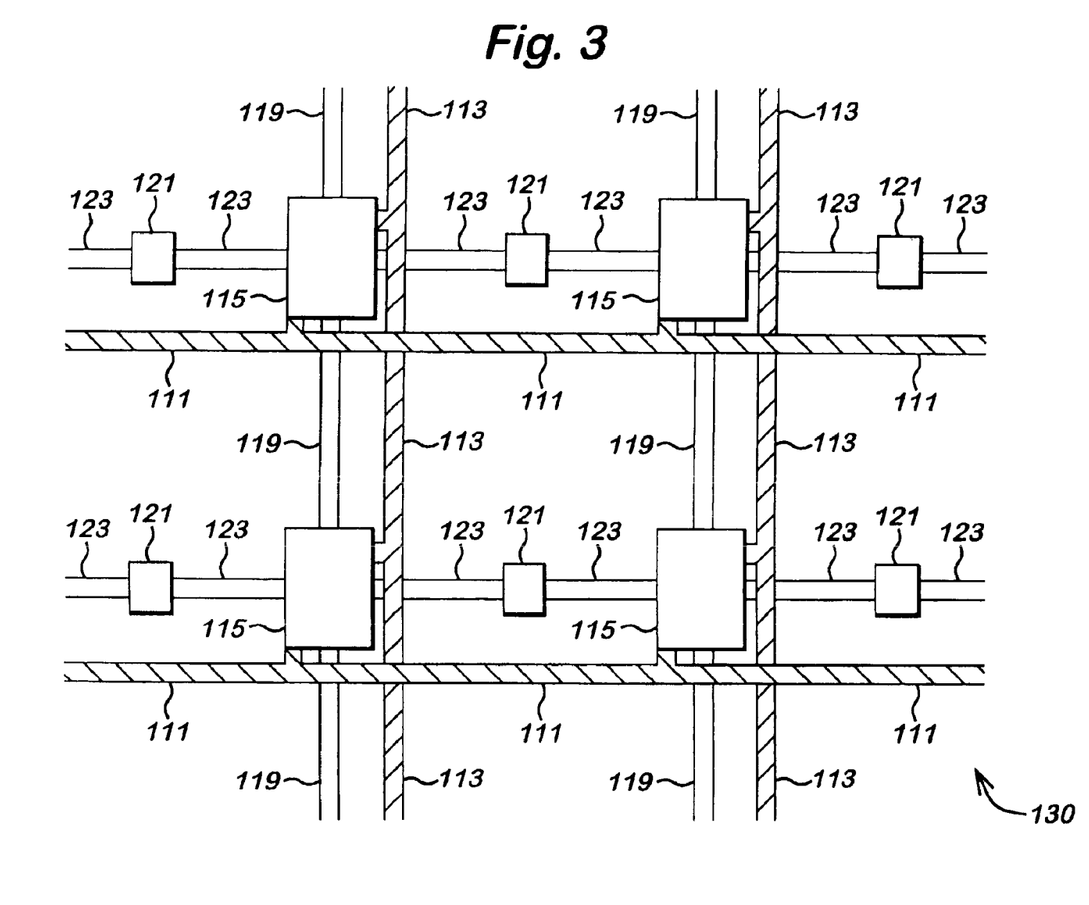
FIG. 3 shows a view of the interconnections of the configuration and data paths in the field programmable device of FIG. 1.

FIG. 3 shows in more detail a part 130 of the processing block 110. Configurable Logic Blocks 121 are connected to each other via horizontal conductive paths 123 and vertical conductive paths 119. Connecting paths together and routing pathways on these conductive paths 119 and 123 are the switching matrices 115. The switching matrices 115 are also connected to the configuration data lines 111 and the address lines 113, which run substantially continuously across the processing block 110.

Figure 4:
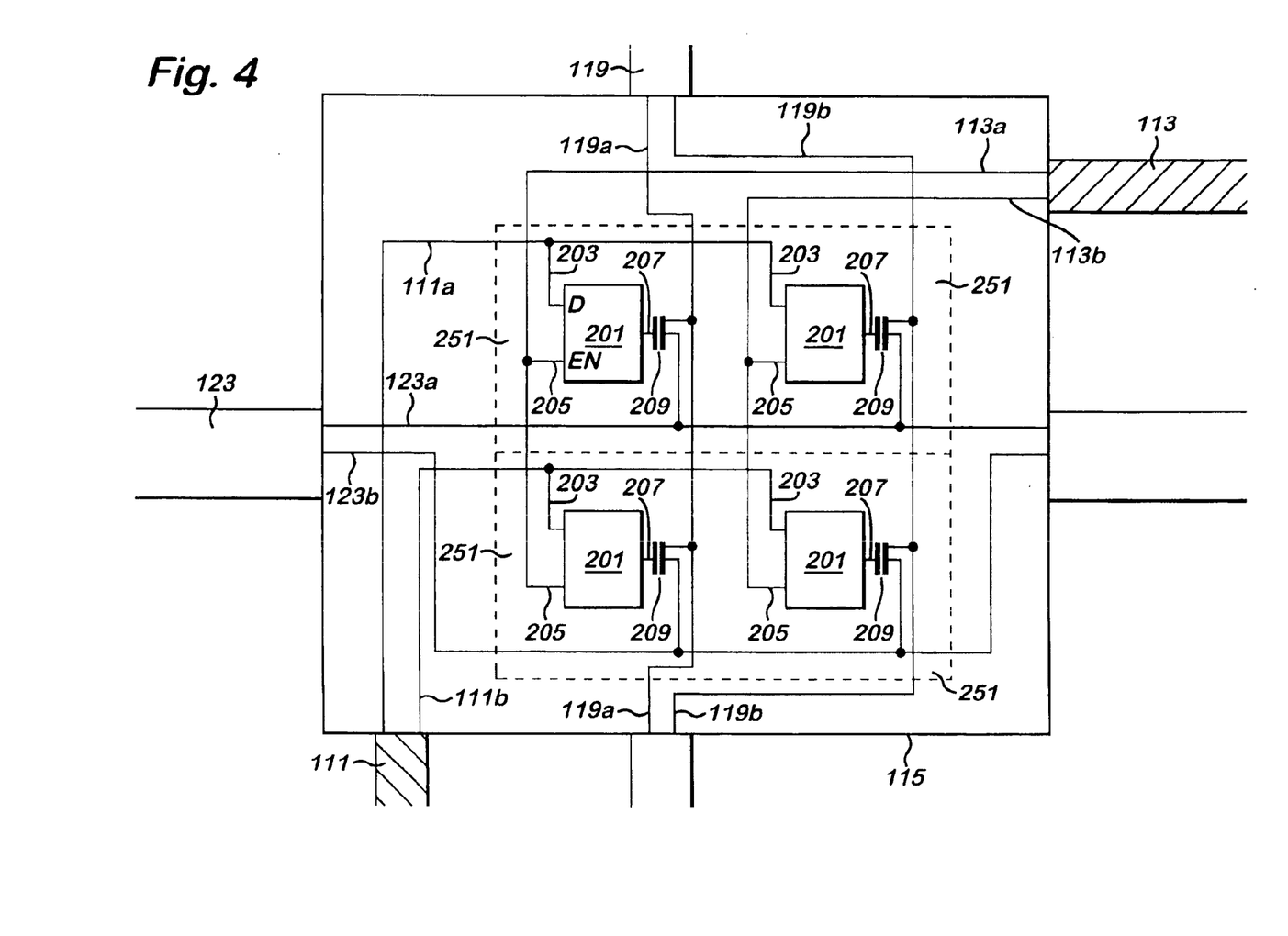
FIG. 4 shows a known switch matrix element capable of being implemented in the circuitry of FIGS. 2 and 3.

FIG. 4 shows in further detail the known circuitry used to configure the switch matrix 115. A switch matrix 115 may include a plurality of horizontal conductive paths (of which 123a and 123b are shown in FIG. 4), a plurality of vertical conductive paths (of which two 119a and 119b are shown in FIG. 4), a plurality of configuration data lines 111a–b, a plurality of address lines 113a and 113b, a plurality of configuration latches 201, and a plurality of connecting transistors 209.

The vertical conductive paths 119a–b and horizontal conductive paths 123a–b provide a conductive path for the data signals to pass through the switch matrix 115. The horizontal conductive paths 123 are arranged so that the horizontal conductive paths 123 on one side of the switch matrix 115 are connected to their corresponding horizontal conductive paths 123 on the other side of the switch matrix 115. The vertical conductive paths 119 are similarly arranged to be connected to their corresponding vertical paths 119 on the other side of the switch matrix 115.

The configuration data lines 111a–b are connected to the corresponding configuration data lines 111. The address lines 113a–b are similarly connected to the corresponding address lines 113.

Each of the configuration latches 201 may include a first data input 203, a second enabling input 205 and a first output 207. The output 207 may be used as an input to the gate of a transistor 209.

The switch matrix 115 has an array of configuration latches 201. Each element 251 of this array may receive an address line 113a or 113b, a configuration line 111a or 111b, a vertical conductive path 119a or 119b, and a horizontal conductive path 123a or 123b. Each element 251 may include a configuration latch 201 and a connection transistor 209.

These elements 251 are tiled so that each element 251 in the same row is connected to the same horizontal conductive path 123a or 123b, and the same data configuration line 111a or 111b. Each element 251 in the same column is connected to the same vertical conductive path 119a or 119b and the same address line 113a or 113b.

The configuration latch 201 in each element 251 has the data input 203 connected to the element configuration data line 111a–b, and the enable input 205 connected to the address line 113a–b. The output 207 of the configuration latch 201 is connected to the gate of the connection transistor 209. One of the conduction terminals of the connection transistor 209 is connected to the horizontal conductive path 123a–b. The remaining conduction terminal is connected to the vertical conductive path 119a–b.

Each element 251 therefore is arranged to receive a different combination of address lines 113a–b and data configuration lines 111a–b, and each element connection transistor 209 is connected to a different combination of horizontal conductive paths 123a–b and vertical conductive paths 119a–b.

In a typical field programmable device, the process of configuring is controlled from the configuration controller 101. The controller 101 controls the address register 103 and configuration data register 125. The address register 103 and configuration register 125 then pass signals on the configuration data lines 111 and address lines 113, respectively, such as to configure the switch matrices 115 in the processing block 110.

In the switch matrices 115, configuration latches 201 are selected by passing an enabling signal, provided by the address line 113a–b, to an enabling input 205. Each configuration latch 201, when enabled, stores a configuration signal. The configuration signal is provided to the configuration latch data input 203 by the configuration data lines 111a–b. The output of the configuration latch 207 can be used to drive the connection transistor 209 to connect two data lines, for example, the interconnection of lines 119a and 123a, and be part of a pathway from one configurable logic block 121 to another configurable logic block 121.

Once the FPD 1 has been configured, it is set into a processing mode whereby the processing block 110 is used to simulate the required circuit. In this mode, the configuration circuitry is generally unused and the data lines are left idle.

Figure 5:
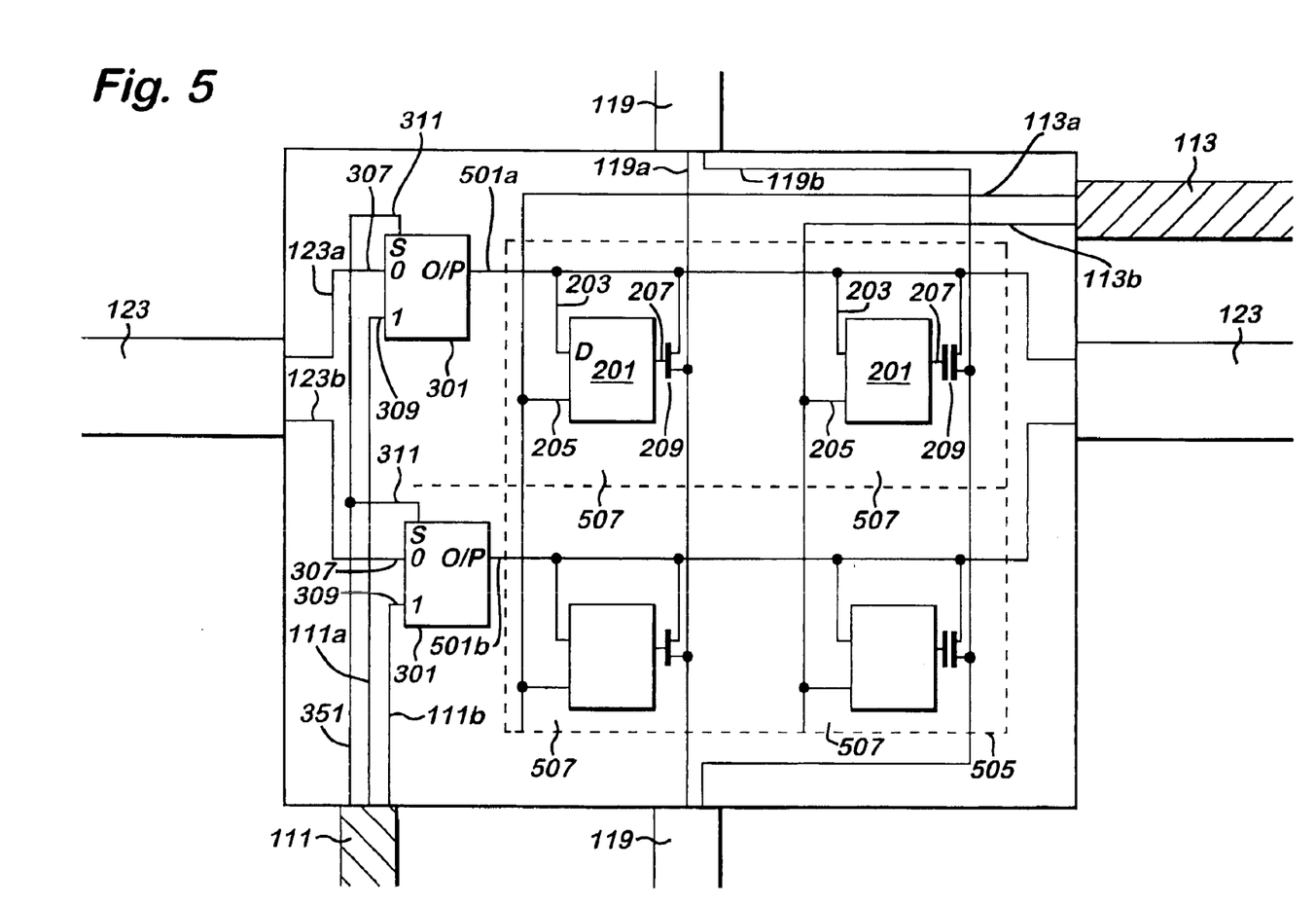
FIG. 5 shows a switch matrix capable of being implemented in the circuitry of FIGS. 2 and 3, and incorporating an embodiment of the present invention.

FIG. 5 shows a switch matrix 115 incorporating an embodiment of the present invention. The embodiment of the present invention may include a switch matrix 115 similar to that described in FIG. 4. The elements of FIG. 5 which are the same as in the preceding figures are referenced by the same reference numbers.

Switch matrix 115 may further include a plurality of horizontal data lines 501, and a plurality of multiplexers 301 and a selection line 351.

The multiplexers 301 may be arranged as a column located before the elements 507 of the tiled array 505 of configuration latches 201. Each miltiplexer 301 may include a first input 307 connected to a horizontal conductive line 123a–b, a second input 309 connected to a configuration data line 111a–b, a third (control) input 311 connected to the selection line 351, and an output connected to a horizontal data line 501a–b.

The horizontal data lines 501a–b run across the rows of the array 505 and are connected to the horizontal conductive paths 123 at the other side of the switch matrix 115.

The selection line 351 is connected to the control input of all of the multiplexers 301 and is brought high when the logic device 7 is in a configuration mode.

Each element 507 of the tiled array 505 is similar to the element 251 from the array of the known switch matrix in FIG. 4. In addition to each element 507 including a separate configuration data line 111a–b and horizontal conductive line 123a–b, each element 507 includes a horizontal data line 501a–b.

The first data input 203 of the configuration latch 201 in FIG. 5 is connected to a horizontal data line 501a–b. Also, the connection transistor 209 is connected, in the embodiment of the present invention, to the horizontal data path 501a–b.

The operation of this circuit of FIG. 5 is dependent on the configuration signal 351. When the configuration signal 351 is high (or low) indicating a configuration mode, the multiplexers 301 pass the configuration signals from the configuration data lines 111a–b to the horizontal data path 501a–b. The configuration latches 201 are now configurable in the same way as before in the known example, whereby the configuration latch 201 has its enable input 205 brought high and the data written to the latch data input 203 via the horizontal links 501a–b.

When the configuration signal 351 is low (or high) indicating a processing mode, the multiplexers 301 block the configuration data but enable the processing data to flow from the horizontal conductive paths 123 through the horizontal data links 501a–b to the output path 123.

This embodiment therefore requires fewer lines than in the switch matrix 115 in order to maintain the same complexity of data links in the processing mode. The problem of configuration error propagation is also stopped. If we join two switch matrices 115 side-by-side, the configuration data entering from one side of the first switch matrix 115 passes out via the horizontal conductive path 123 which is then isolated at the next switch matrix 115 by the multiplexer 301 therein.

Figure 6:
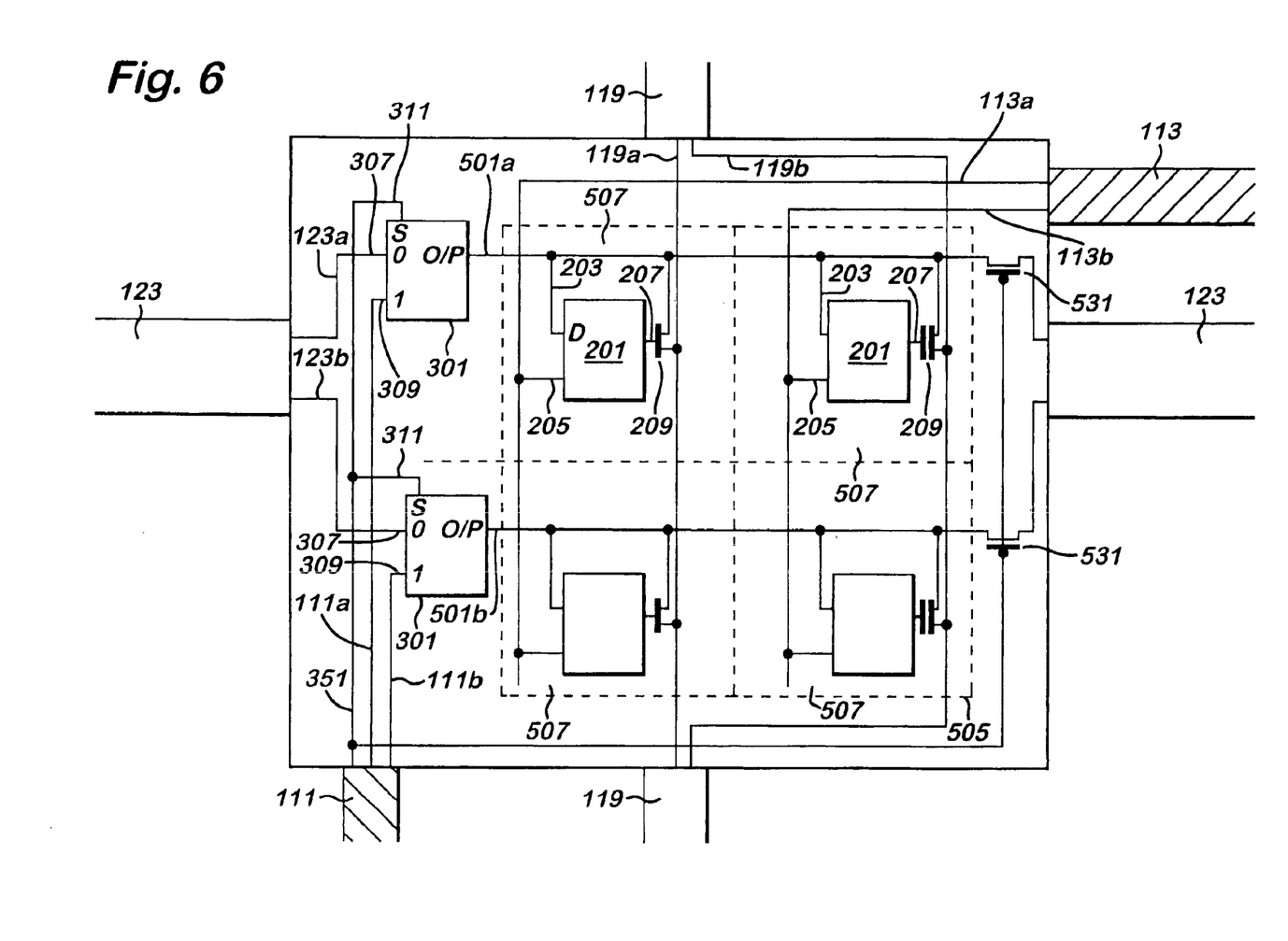
FIG. 6 shows a switch matrix incorporating a second embodiment of the present invention.

FIG. 6 shows a switch matrix 115 incorporating another embodiment of the present invention. The embodiment of the present invention in FIG. 6 may include a switch matrix 115 similar to that described in FIG. 5. The elements of FIG. 6 which are the same as in the preceding figures are referenced by the same reference numbers.

The switch matrix 115 of FIG. 6 includes a plurality of switches 531. The plurality of switches 531 are arranged as a column after and/or adjacent to the array 505 of elements 507. The switches 531 may include a first (data) input, a second (select) input and an output. The first (data) input is connected to the horizontal data line 501a–b, the output is connected to a horizontal conductive path 123, and the second (select) input is connected to the selection line 351.

Each switch 531 is arranged to function so that when the FPD 1 is placed in configuration mode, the switch 531 is open and isolates the first (data) input from the output. When the FPD 1 is placed in a processing mode, the switch 531 is closed and connects the first (data) input to the output. Each switch, as shown in FIG. 6, is an MOS transistor but embodiments of the present invention may also be realised by replacing the MOS transistor with a tri-state buffer, or a device known in the art to perform the same functionality.

The embodiment shown in FIG. 6 has the further advantage over the art in that during the configuration mode, the electrical path through the switch matrix 115 is isolated from passing further than the switch matrix 115. This reduces the loading on the configuration data lines 111 as they are not required to handle the loading caused by additional circuitry other than the configuration circuitry. This reduced loading in embodiments of the invention may allow quicker configuration or smaller configuration drive transistors within the configuration registers 125.

Figure 7:
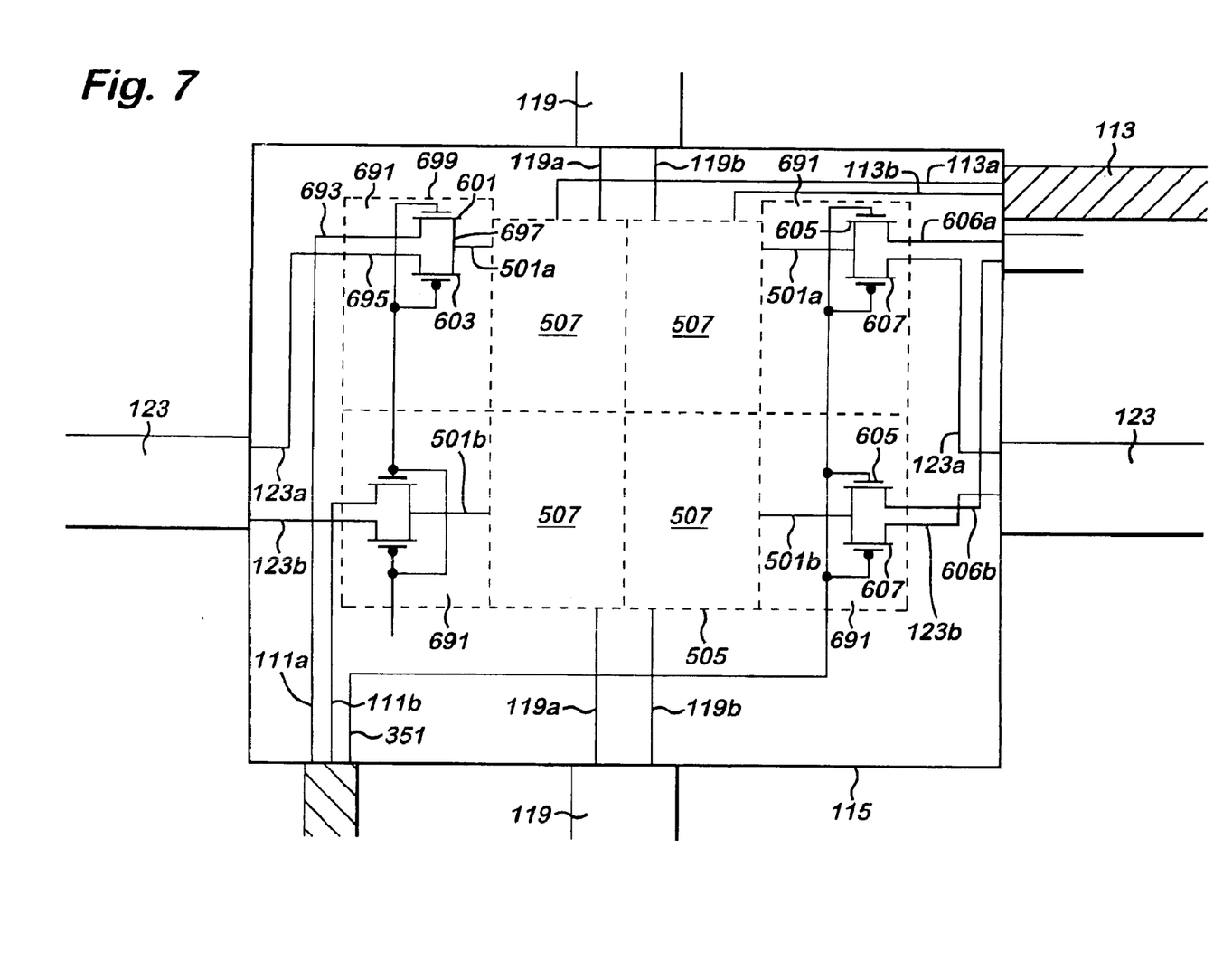
FIG. 7 shows a switch matrix incorporating a further embodiment of the present invention.

FIG. 7 shows switch matrix circuitry featuring another embodiment of the present invention. In this embodiment, the switch matrix 115 may include a switched matrix 115 similar to that described in FIG. 5. The elements of FIG. 7 which are the same as in the preceding figure are referenced by the same reference numbers.

The switch matrix 115 of FIG. 7 may further include a plurality of bi-directional switches 691 and a plurality of horizontal data read lines 606a–b. Each bi-directional switch 691 may be a four terminal device and include a first input/output terminal 693, a second input/output terminal 695, an output/input terminal 697 and a selection terminal 699.

In a first mode of operation dependent on the value of the selection terminal 699, the first input/output terminal 693 is connected to the output/input terminal 697, while the second input/output terminal 695 is isolated. In a second mode of operation also dependent on the value of the selection terminal 699, the second input/output terminal 695 is connected to the output/input terminal 697, while the first input/output terminal 693 is isolated. The switch 691 allows signals to flow between the two connected terminals, either between 693 and 697, or between 695 and 697 in both directions and is therefore bi-directional.

In the embodiment of the present invention shown in FIG. 7, the bi-directional switch 691 may include a pair of complementary CMOS transistors 601 and 603. The gates of the transistors 601, 603 are connected together and form the selection terminal 699 of the bi-directional switch 691. One of the conduction terminals of each transistor 601, 603 is connected together to form the output/input terminal 697 of the bi-directional switch 691. The remaining conduction terminals form the first and second input/output terminals 693, 695 of the bi-directional switch 691.

Other known electronic devices may used instead of or in conjunction with the above-described transistor pairs, to produce the same features as detailed in the description of the bi-directional switch 691. These known devices may include tri-state buffers, which are a cascaded pair of inverters with enable terminals.

The bi-directional switches 691 are arranged in two columns along either side of the array 505 of elements 507, as shown in FIG. 7. One column replaces the column of multiplexers 301 used in the previous embodiment (FIG. 6).

Each switch 691 of this first column of bi-directional switches 691 has a first input/output terminal 693 connected to the configuration data line 111 controlling the row. A second input/output terminal 695 of each bi-directional switch 691 is connected to the horizontal conduction path 123 for that row. The output/input terminal 697 for each bi-directional switch 691 is connected to the horizontal data line 501a–b for that row. The selection input for all of the bi-directional switches 691 in the first column is connected to the selection line 351.

The second column of bi-directional switches 691 is arranged along the array 505 of elements 507 opposite the first column of bi-directional switches 691.

Each output/input terminal 697 of the second column of bi-directional switches 691 is connected to the horizontal data line 501a–b for that row. The first input/output terminal 693 of each bi-directional switch 691 for the second column is connected to the read line 606a–b. The second input/output terminal of each bi-directional switch 691 in the second column is connected to the horizontal conductive path 123a–b for that row. The selection terminals 699 for all of the second column bi-directional switches 691 are connected to the selection line 351.

During configuration of the embodiment of the present invention shown in FIG. 7, in other words when the configuration signal 351 is high (or low), the first column of bi-directional switches 691 connects the configuration signals from the configuration data lines 111a–b to the horizontal data line 501a–b, thereby enabling the configuration data to be loaded into the latches 201. At the same time, the second column of bi-directional switches 691 pass the same signal to a read out line 606, which can be used for test purposes.

When the configuration is complete, the configuration signal on the configuration line 351 is brought low, and the first and second column of bi-directional switches 691 connect the horizontal data lines 123a–b, from one side of the switch matrix 115 to the opposite side thereof.

The embodiment of the present invention contains the additional advantage that by using bi-directional switches 691 it is possible to pass signals on the horizontal data paths 123a–b in both directions. This therefore allows a more complex series of data interconnections to be programmed in a configuration mode and allows the FPD 1 to simulate more complex circuitry without adding a prohibitive additional amount of hardware or software redesign.

The same configuration data advantages as explained in the previous embodiments also apply to this embodiment. Configuration data does not propagate through the switch matrix 115 as it is passed via the second column of bi-directional switches 691 via the read out line 606 and therefore is unable to corrupt data. The second column of bi-directional switches 691 during configuration passes configuration signals along readout lines 606a–b therefore adding only the additional load of the readout line, which may in embodiments of the present invention be designed to have low resistance and reactance values. This may still be an advantage over the art which passes the configuration data through processing paths, thus heavily loading the configuration data lines 111a–b.

Embodiments of the present invention may also be arranged so that the horizontal data lines 501 are in addition to rather than replacing the horizontal conductive paths passing through the switch matrix 115. In this embodiment, the additional horizontal data lines 501 may be used to provide additional interconnection complexity without prohibitive additional hardware.

The present invention is not limited to configuration within a switching matrix 115, but can be applied in further embodiments of the invention to any configurable elements within an FPD.

Although exemplary embodiments of the method and apparatus of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed:

1. A field programmable device, comprising:
   a plurality of logic blocks;
   a plurality of configurable connections coupled to the logic blocks;
   a plurality of configuration circuits for configuring the configurable connections, each configuration circuit comprising a switching circuit, at least one storage element for storing configuration information and a plurality of lines coupled to the switching circuit and the at least one storage element, wherein
      when the field programmable device is in a configuration mode of operation, the switching circuit causes configuration signals to be passed to the at least one storage element for selective storage therein via the plurality of lines, the switching circuit further isolating the at least one storage element from configuration signals from an adjacent configuration circuit, and
      when the field programmable device is in a processing mode of operation, data is carried on the plurality of lines to at least one logic block.

2. A device as claimed in claim 1 wherein at least one of said lines passes data and configuration signals to a plurality of logic blocks, a plurality of configuration circuits, or at least one logic block and the at least one configuration circuit.

3. A device as claimed in claim 1 wherein in said processing mode only data is passed within the at least one configuration circuit or a logic block on at least one of the lines.

4. A field programmable device, comprising:
   a plurality of logic blocks;
   a plurality of configurable connections coupled to the logic blocks; and
   at least one configuration circuit for configuring the configurable connections, comprising a switching circuit, at least one storage element for storing configuration information and a plurality of lines coupled to the switching circuit and the at least one storage element, wherein when the field programmable device is in a configuration mode of operation, the switching circuit causes configuration signals to be passed to the at least one storage element for selective storage therein via the plurality of lines, and when the field programmable device is in a processing mode of operation, data is carried on the plurality of lines to at least one logic block;
   wherein said switching circuit comprises at least one multiplexer.

5. A device as claimed in claim 1, wherein said switching circuit comprises a two-way arrangement allowing signals to pass along said plurality of lines in either of two directions.

6. A device as claimed in claim 5, wherein said switching circuit comprises a pair of transmission gate transistors.

7. A device as claimed in claim 6, wherein one of said transmission gate transistors is turned on in the configuration mode and turned off in the processing mode and the other of the transmission gate transistors is turned off in the configuration mode and turned on in the processing mode.

8. A device as claimed in claim 1, wherein said switching circuit is controlled by a control signal which has a first state in the configuration mode and a second state in the processing mode.

9. A field programmable device, comprising:
   a plurality of logic blocks;
   a plurality of configurable connections coupled to the logic blocks; and
   at least one configuration circuit for configuring the configurable connections, comprising a switching circuit, at least one storage element for storing configuration information and a plurality of lines coupled to the switching circuit and the at least one storage element, wherein when the field programmable device is in a configuration mode of operation, the switching circuit causes configuration signals to be passed to the at least one storage element for selective storage therein via the plurality of lines, and when the field programmable device is in a processing mode of operation, data is carried on the plurality of lines to at least one logic block;
   wherein said switching circuit is controlled by a control signal which has a first state in the configuration mode and a second state in the processing mode; and
   wherein said switching circuit comprises at least one multiplexer having a control input, and wherein said control signal is used as a control input to determine which input of the multiplexer is selected.

10. A device as claimed in claim 8, wherein said switching circuit comprises a pair of pass gate transistors, and said control signal is applied to the gate terminals of the pass gate transistors.

11. A device as claimed in claim 1, wherein said logic blocks are configurable.

12. A device as claimed in claim 1, wherein said configurable connections and said at least one configuration circuit form one or more switching matrices.

13. A device as claimed in claim 1, wherein said at least one configuration circuit comprises a plurality of storage elements.

14. A device as claimed in claim 13, wherein said storage elements are provided with an enable signal in the configuration mode.

15. A device as claimed in claim 1, wherein said field programmable device comprises a field programmable gate array.

16. A device as claimed in claim 1, wherein the said switching circuit is arranged in a configuration mode to isolate a portion of at least one of said plurality of lines from at least one other portion of the same plurality of lines.

17. A method of utilizing a field programmable device having a plurality of logic blocks, configurable connections connected between the logic blocks and a plurality of storage elements for storing configuration information, comprising:

configuring the configurable connections, including utilizing a plurality of lines to carry configuration data to the storage elements and isolating the storage elements from signals from adjacent configurable connections; and operating the field programmable device in a normal mode of operation, including utilizing the plurality of lines for carrying data to at least one logic block.

18. The method of claim 17, wherein the step of configuring comprises utilizing a control signal to couple configuration input lines to the plurality of lines.

19. The method of claim 18, wherein the step of operating comprises utilizing the control signal to couple data lines to the plurality of lines.

20. The method of claim 19, wherein signal flow between the data lines and the plurality of lines is capable of being bi-directional.

21. A field programmable device, comprising:

a plurality of logic blocks;

a plurality of configurable lines coupled to the logic blocks; and a plurality of configuration circuits, for configuring the configurable lines, comprising a plurality of lines and at least one storage element, wherein when the field programmable device is in a configuration mode, configuration data is passed to the at least one storage element over the plurality of lines, the configuration circuit further isolating the at least one storage element from configuration signals from an adjacent configuration circuit, and when the field programmable device is in a normal mode of operation, the plurality of lines are coupled to at least some of the configurable lines for passing data to at least one of the logic blocks.

22. The field programmable device of claim 21, wherein the configuration circuit comprises a switching circuit coupled between the configurable lines and the plurality of lines.

23. A field programmable device, comprising:

a plurality of logic blocks;

a plurality of configurable lines coupled to the logic blocks; and a configuration circuit for configuring the configurable lines, comprising a plurality of lines and at least one storage element, wherein when the field programmable device is in a configuration mode, configuration data is passed to the at least one storage element over the plurality of lines and when the field programmable device is in a normal mode of operation, the plurality of lines are coupled to at least some of the configurable lines for passing data to at least one of the logic blocks;

wherein the configuration circuit comprises a switching circuit coupled between the configurable lines and the plurality of lines; and wherein the switching circuit comprises at least one multiplexer circuit, each at least one multiplexer circuit having a first port coupled to a configurable line, a second port coupled to a configuration line, a third port coupled to one of the plurality of lines and a control port coupled to a control signal.

24. The field programmable device of claim 22, wherein the switching circuit comprises a first pass gate coupled between a first of the configurable lines and a first of the plurality of lines, and a second pass gate coupled between a configuration line and the first of the plurality of lines.

25. The field programmable device of claim 21, wherein the configuration circuit comprises a first switching circuit coupled between the configuration lines and a first end of each of the plurality of lines, and a second switching circuit coupled between the configuration lines and a second end of each of the plurality of lines.

26. A field programmable device, comprising:

a plurality of logic blocks;

a plurality of configurable lines coupled to the logic blocks; and a configuration circuit for configuring the configurable lines, comprising a plurality of lines and at least one storage element, wherein when the field programmable device is in a configuration mode, configuration data is passed to the at least one storage element over the plurality of lines and when the field programmable device is in a normal mode of operation, the plurality of lines are coupled to at least some of the configurable lines for passing data to at least one of the logic blocks;

wherein the configuration circuit comprises a first switching circuit coupled between the configuration lines and a first end of each of the plurality of lines, and a second switching circuit coupled between the configuration lines and a second end of each of the plurality of lines; and wherein the first switching circuit comprises a multiplexer circuit and the second switching circuit comprises at least one pass gate transistor.

27. The field programmable device of claim 25, wherein the first switching circuit comprises a first pass gate transistor coupled between a configurable line and a first end of a first of the plurality of lines, and a second pass gate transistor coupled between a configuration line and the first end of the first of the plurality of lines.

28. The field programmable device of claim 27, wherein the second switching circuit comprises a third pass gate transistor coupled between a second end of the first of the plurality of lines and the configurable line.

29. A field programmable device comprising;
a plurality of logic blocks;
a plurality of configurable connections;
switching means;
a plurality of lines extending at least partially through said device;
whereby in a configuration mode, the switching means causes configuration signals to be passed to said configurable connections via said plurality of lines, the switching means further isolating the at least one storage element from configuration signals from an adjacent configuration circuit, and in a processing mode, said plurality of lines are used in at least one of at least one logic block and at least one connection to carry data.

* * * * *